(12) United States Patent
Hoenk et al.

(10) Patent No.: US 12,660,335 B2
(45) Date of Patent: Jun. 16, 2026

(54) 2D-DOPED SURFACE PASSIVATION STRUCTURE AND METHOD OF MANUFACTURE

(71) Applicant: California Institute of Technology, Pasadena, CA (US)

(72) Inventors: Michael E. Hoenk, Valencia, CA (US); April D. Jewell, Los Angeles, CA (US); Todd J. Jones, Altadena, CA (US); Shouleh Nikzad, Valencia, CA (US)

(73) Assignee: California Institute of Technology, Pasadena, CA (US)

( * ) Notice: Subject to any disclaimer, the term of this patent is extended or adjusted under 35 U.S.C. 154(b) by 388 days.

(21) Appl. No.: 18/356,970

(22) Filed: Jul. 21, 2023

(65) Prior Publication Data

US 2024/0030269 A1      Jan. 25, 2024

Related U.S. Application Data

(60) Provisional application No. 63/391,156, filed on Jul. 21, 2022.

(51) Int. Cl.
H10F 39/00          (2025.01)
(52) U.S. Cl.
CPC .........  H10F 39/024 (2025.01); H10F 39/805 (2025.01); *H10F 39/026* (2025.01)
(58) Field of Classification Search
CPC .... H10F 39/024; H10F 39/805; H10F 39/026; H10F 71/129; H10F 71/1035; H10F 71/103; H10F 71/1221; H10F 71/1224
See application file for complete search history.

(56) References Cited

U.S. PATENT DOCUMENTS

| | | |
|---|---|---|
| 5,376,810 A | 12/1994 | Hoenk et al. |
| 8,395,243 B2 | 3/2013 | Hoenk |
| 8,828,852 B2 | 9/2014 | Hoenk et al. |

(Continued)

OTHER PUBLICATIONS

Blouke et al., "A Simplified model of the back surface of a charge-coupled device", Proceedings of SPIE, Charge-Coupled Devices and Solid State Optical Sensors II, vol. 1447, 1991, pp. 142-155, doi: 10.1117/12.45320.

(Continued)

*Primary Examiner* — Thanhha S Pham

(74) *Attorney, Agent, or Firm* — KPPB LLP

(57)          ABSTRACT

Disclosed herein is a method of coating a detector. The method includes: providing the detector including a detector surface; performing a planarization process to the detector surface; performing a piranha clean process to the planarized surface; performing a slight etch to the piranha cleaned surface; performing an ammonium fluoride etching step to the slight etched surface to create a decontaminated surface. The decontaminated surface is an atomically flat silicon surface with surface and subsurface damage and contamination significantly reduced. A multilayer 2D-doped layer may be epitaxially grown on the decontaminated surface. The detector may provide high quantum efficiency with uniform and stable performance from room temperature to cryogenic temperatures.

18 Claims, 10 Drawing Sheets

(56)                    References Cited

U.S. PATENT DOCUMENTS

| | | | |
|---|---|---|---|
| 9,024,344 B2 | 5/2015 | Hoenk | |
| 10,825,950 B2 * | 11/2020 | Gregory | H10F 39/026 |

OTHER PUBLICATIONS

Hoenk et al., "2D-doped silicon detectors for UV/optical/NIR and X-ray astronomy", Proceedings SPIE 12191, X-Ray, Optical, and Infrared Detectors for Astronomy X, vol. 12191, Aug. 29, 2022, pp. 1219113-1-1219113-20, doi: 10.1117/12.2631542.

Hoenk et al., "Growth of a delta-doped silicon layer by molecular beam epitaxy on a charge-coupled device for reflection-limited ultraviolet quantum efficiency", Applied Physics Letters, vol. 61, No. 9, Aug. 31, 1992, pp. 1084-1086, doi: 10.1063/1.107675.

Hoenk et al., "Superlattice-doped silicon detectors: progress and prospects", Proceedings of SPIE, High Energy, Optical, and Infrared Detectors for Astronomy VI, vol. 9154, 2014, pp. 915413-1-915413-13, doi: 10.1117/12.2057678.

Jenkins et al., "High Precision Photometry with Back-Illuminated CCDs", ASP Conference Series, vol. 119, 1997, pp. 277-280.

Nikzad et al., "Ultrastable and Uniform EUV and UV Detectors", Proceedings of SPIE, Instrumentation for UV/EUV Astronomy and Solar Missions, vol. 4139, 2000, pp. 250-258, doi: 10.1117/12.410541.

* cited by examiner

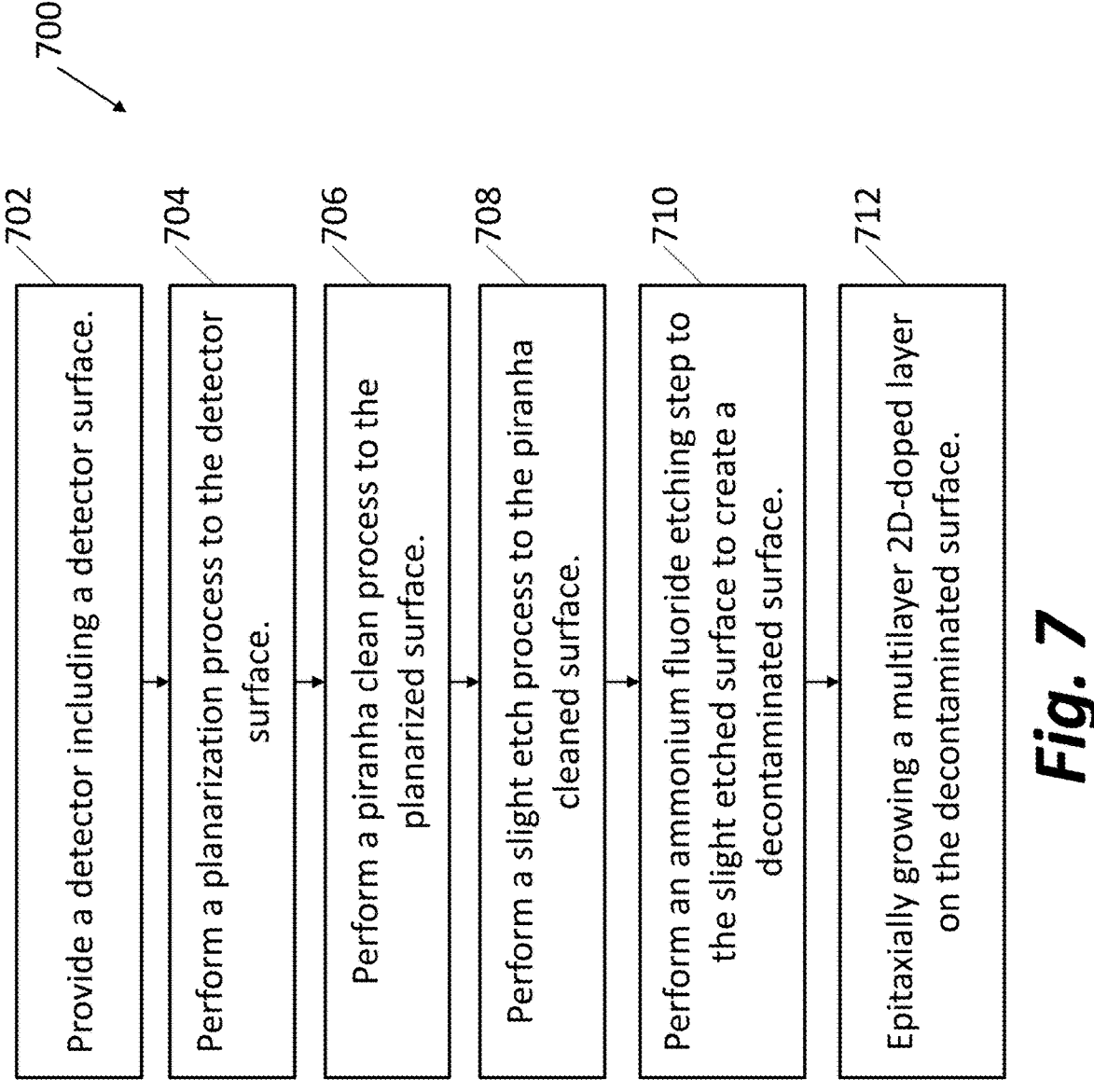

700

702 Provide a detector including a detector surface.

704 Perform a planarization process to the detector surface.

706 Perform a piranha clean process to the planarized surface.

708 Perform a slight etch process to the piranha cleaned surface.

710 Perform an ammonium fluoride etching step to the slight etched surface to create a decontaminated surface.

712 Epitaxially growing a multilayer 2D-doped layer on the decontaminated surface.

*Fig. 7*

2D-DOPED SURFACE PASSIVATION STRUCTURE AND METHOD OF MANUFACTURE

CROSS-REFERENCE TO RELATED APPLICATIONS

This application claims the benefit of and priority under 35 U.S.C. § 119(e) to U.S. Provisional Patent Application Ser. No. 63/391,156 entitled "Enhanced 2d-Doping Surface Passivation Structure and Process," filed Jul. 21, 2022, which is incorporated herein by reference in its entirety for all purposes.

STATEMENT OF FEDERAL SUPPORT

This invention was made with government support under Grant No. 80NMO0018D0004 awarded by NASA (JPL). The government has certain rights in the invention.

FIELD OF THE INVENTION

The present invention generally relates to a 2D-doped surface passivation utilized for a detector.

BACKGROUND

Exoplanet physics and time domain astrophysics may benefit from precise optical photometry (light curves). Since the usage of charge-coupled devices (CCDs), astronomers have worked to develop and optimize CCDs for spaceborne telescopes. The response of CCDs may be extended beyond the visible by thinning and back illumination. One of the more challenging obstacles to realizing the potential of CCDs for astronomy has been the passivation of defects and traps at surfaces and interfaces. Stable, high charge collection efficiency may be advantageous in relevant environments for space. Thus, a strong surface passivation and stable, high efficiency response in space-relevant thermal and radiation environments may be advantageous.

SUMMARY OF THE INVENTION

In some aspects, the techniques described herein relate to a method of coating a detector, the method including: providing the detector including a detector surface; performing a planarization process to the detector surface; performing a piranha clean process to the planarized surface; performing a slight etch to the piranha cleaned surface; performing an ammonium fluoride etching step to the slight etched surface to create a decontaminated surface, wherein the decontaminated surface is an atomically flat silicon surface with surface and subsurface damage and contamination significantly reduced, epitaxially growing a multilayer 2D-doped layer on the decontaminated surface.

In some aspects, the techniques described herein relate to a method, wherein the planarization process includes a chemical mechanical polishing (CMP) process.

In some aspects, the techniques described herein relate to a method, wherein the planarization process includes a wafer thinning process.

In some aspects, the techniques described herein relate to a method, wherein the wafer thinning process is a grinding process.

In some aspects, the techniques described herein relate to a method, wherein the slight etch is a Takizawa's slight etch process.

In some aspects, the techniques described herein relate to a method, wherein the Takizawa's slight etch process is a wet etch with nitric acid including a trace of hydrofluoric acid.

In some aspects, the techniques described herein relate to a method, further including performing a UV ozone process to the resultant decontaminated surface.

In some aspects, the techniques described herein relate to a method, further including performing an HF spin etch after the ozone process.

In some aspects, the techniques described herein relate to a method, further including performing an ethanol rinse after the HF spin etch.

In some aspects, the techniques described herein relate to a method, wherein the epitaxial growth process is an MBE crystalline growth.

In some aspects, the techniques described herein relate to a method, wherein the MBE crystalline growth produces a multi-layered delta doped crystalline layer with alternating doped and undoped layers.

In some aspects, the techniques described herein relate to a method, wherein the undoped layer is intrinsic silicon and doped layer includes boron.

In some aspects, the techniques described herein relate to a method, wherein producing the multi-layered delta doped crystalline layer includes alternately and cyclically contacting the decontaminated surface with a source including silicon and a source including dopants.

In some aspects, the techniques described herein relate to a method, wherein the detector includes a silicon detector with a bulk silicon wafer.

In some aspects, the techniques described herein relate to a method, wherein the detector includes a circuitry surface opposite to the detector surface with CCD circuitry.

In some aspects, the techniques described herein relate to a method, wherein the piranha clean process is wet etch process including a 3:1 mixture of sulfuric acid and 30% hydrogen peroxide.

In some aspects, the techniques described herein relate to a method, wherein the detector includes high quantum efficiency with uniform and stable performance from room temperature to cryogenic temperatures.

In some aspects, the techniques described herein relate to a method, wherein the detector includes quantum efficiency substantially equivalent to a reflection limit across the entire spectral range from UV to visible from room temperature to cryogenic temperatures.

BRIEF DESCRIPTION OF THE DRAWINGS

The description will be more fully understood with reference to the following figures and data graphs, which are presented as various embodiment of the disclosure and should not be construed as a complete recitation of the scope of the disclosure, wherein:

FIG. 7 is a flow chart of the surface etch process described above which occurs after CMP of the detector in accordance with an embodiment of the invention.

DETAILED DESCRIPTION

Figures 1A, 1B:
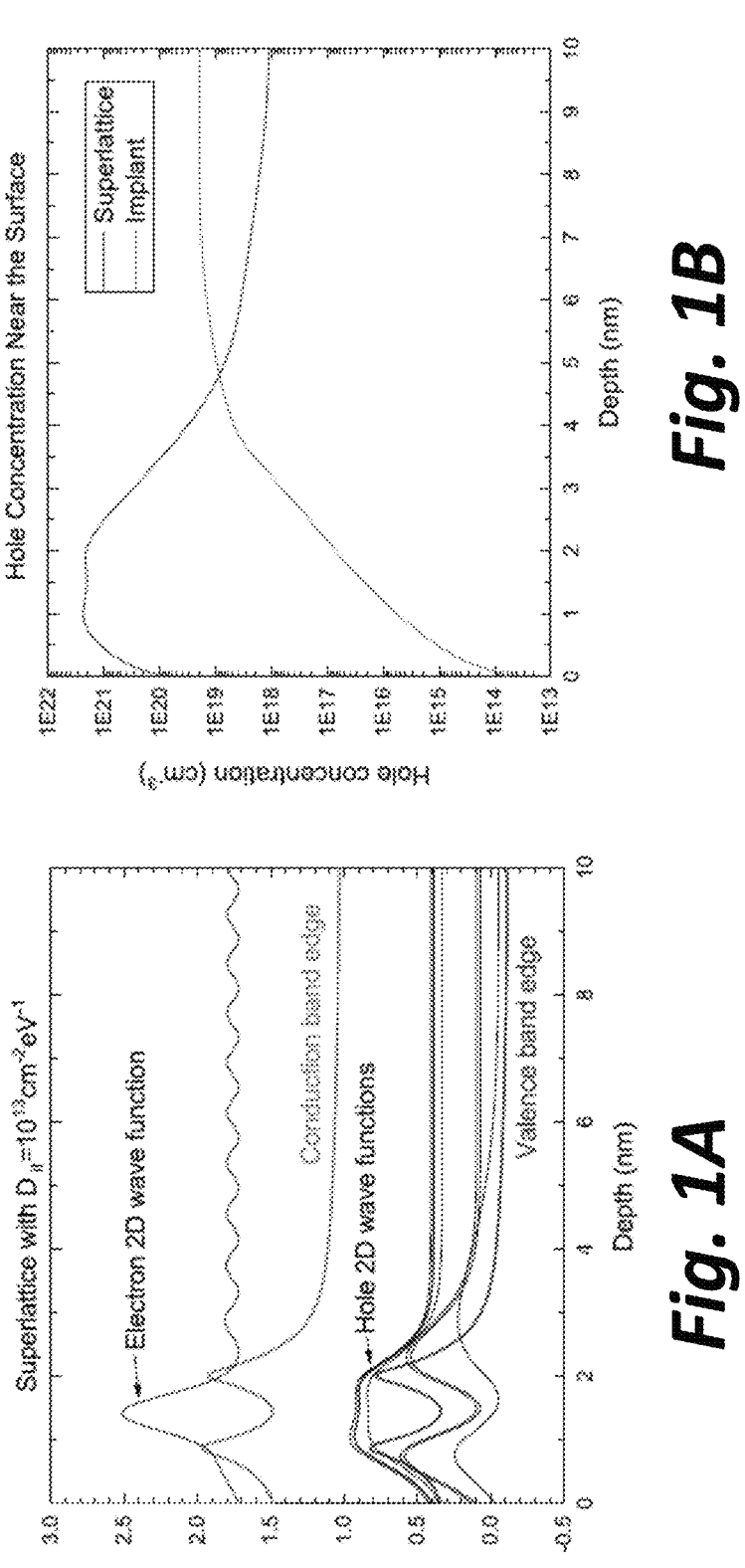
FIG. 1A is a plot of quantum confinement in a 2D-doping superlattice.
FIG. 1B is a plot of near-surface hole concentration.

The discovery of quantum efficiency hysteresis in CCDs motivate efforts to develop stable surface passivation methods for thinned CCDs. Weakly passivated CCDs suffer low, temperature-dependent quantum efficiency. Previous CMOS image sensors include back-thinned CCDs. By doping the back surface to $10^{18}$ cm$^{-3}$ and depositing an antireflection coating, high quantum efficiency is achieved. However, the UV quantum efficiency (QE) is very low in these CCDs due to limitations in thinning and passivation, compounded by extremely shallow absorption of UV photons in the CCD surface. The two main approaches to surface passivation are backside charging and surface doping. Both methods are based on forming a strong electric field near the surface in order to drive photogenerated electrons toward the front surface collection wells, and thereby prevent losses due to recombination at the Si—SiO$_2$ interface. In some examples, backside charging methods passivate the surface with an external electric field, while, in some examples, surface doping methods produce fields internally by creating a doping profile with a high surface density and shallow distribution. Backside charging methods may enable the highest possible QE, but they are sensitive to charged defects at the Si—SiO$_2$ interface. Surface doping methods (e.g. ion-implantation) are relatively insensitive to interface traps, but have lower QE due to recombination in the highly doped surface. It had been discovered that reported degradation of QE in an ion-implanted CCD at low temperatures. This detector was nearly QE-pinned at room temperature, but as the CCD was cooled to −120° C. the QE decreased significantly. It was thus discovered that in order to provide margin against radiation-induced surface traps, devices include high surface passivation strength to stabilize the QE over the operation temperature ranges.

In order to achieve high QE, the dopant gradient may be steep enough to achieve a surface electric field>5×10$^4$ V/cm, while the surface dopant density would have to be >5×10$^{19}$ cm$^{-3}$ in order to keep the width of the surface depletion region below 2 nm. These requirements may be difficult to achieve, and efforts to optimize ion-implantation processes for thinned CCDs has not yielded significant results. Various examples of ion implanted thinned CCDs are described in Michael E. Hoenk, et. al., "2D-doped silicon detectors for UV/optical/NIR and x-ray astronomy," Proc. SPIE 12191, X-Ray, Optical, and Infrared Detectors for Astronomy X, 1219113 (29 Aug. 2022) which is hereby incorporated by reference in its entirety for all purposes.

Disclosed herein is 2D-doped detector technologies which may enable stability and sensitivity over a wide spectral range, spanning soft X-rays through the Ultraviolet (UV), visible, and near infrared. The unique capabilities of 2D-doped detectors may be particularly important in the advancement of silicon detectors.

Various disclosed embodiments may include epitaxial growth of 2D-doped silicon on back-illuminated CCDs and CMOS image sensors. The epitaxial growth may be a molecular beam epitaxial (MBE) growth. These image sensors may include high charge collection efficiency with exceptional stability in space and other harsh environments. Lifetime tests performed on 2D-doped CMOS image sensors using pulsed DUV lasers have demonstrated the unique stability of 2D-doped detectors against high levels of radiation-induced surface damage. The image sensors include growth of delta-doped silicon by molecular beam epitaxy (MBE) on CCDs for reflection-limited UV quantum efficiency. Image sensors including a grown delta-doped silicon layer are described in U.S. Pat. No. 5,376,810, entitled "Growth of delta-doped layers on silicon CCD/S for enhanced ultraviolet response" and filed Dec. 21, 1993, which is hereby incorporated by reference in its entirety for all purposes. Further, image sensors including a grown delta-doped silicon layer are described in U.S. Pat. No. 8,395,243, entitled "Surface passivation by quantum exclusion using multiple layers" and filed Jun. 15, 2011, which is hereby incorporated by reference in its entirety for all purposes. Further, image sensors including a grown delta-doped silicon layer are described in U.S. Pat. No. 9,024,344, entitled "Surface passivation by quantum exclusion using multiple layers" and filed Mar. 8, 2013, which is hereby incorporated by reference in its entirety for all purposes. Further, image sensors including a grown delta-doped silicon layer are described in U.S. Pat. No. 8,828,852, entitled "Delta-doping at wafer level for high throughput, high yield fabrication of silicon imaging arrays" and filed Dec. 10, 2010, which is hereby incorporated by reference in its entirety.

In growing a delta-doped layer, a 2.5 nm layer of crystalline silicon may be grown on a fully-processed, back-thinned CCD. Delta-doped CCDs may contain an exceptionally high density of electrically-active boron (e.g. 2×1014 B/cm$^2$) in a single layer of the silicon crystal, which may enable stable, uniform, reflection-limited QE. Delta-doped CCDs may remain stable over a period of years independent of environmental conditions. The image sensors including growths of delta-doped silicon may include near 100% internal QE in the soft X-ray and extreme ultra-violet (EUV) spectral range. An MBE crystalline growth process may produce a multi-layered delta doped crystalline layer with alternating doped and undoped layers. The undoped layer may be intrinsic silicon and the doped layer may include boron. Producing the multi-layered delta doped crystalline layer may include alternately and cyclically contacting the decontaminated surface with a source including silicon and a source including dopants.

The unique properties of 2D-doped silicon detectors may be related to exceptionally high dopant densities, which are enabled by self-organization of dopant atoms during MBE growth. Delta-doping may include depositing dopant atoms on an atomically flat silicon surface, and then encapsulating the delta-doped layer by epitaxial growth of crystalline silicon. This process has been demonstrated at surface densities up to half a monolayer of dopant atoms (e.g., up to $3.4 \times 1014$ cm$^{-2}$ on Si (100)). Dopant concentrations more than an order of magnitude higher than the solid solubility limit of conventional 3D-doping methods may be possible because self-organization and geometric frustration prevent dopant atoms from occupying nearest-neighbor sites in the 2D-doped surface. Electrically active dopant concentrations up to 1022 cm$^{-3}$ with mobilities of 20 cm$^2$/V$_s$ have been achieved in boron delta-doped silicon, and full dopant activation and metallic conduction have been achieved in delta-doped silicon at temperatures as low as 4K. Quantization of near-surface electron and hole states in 2D-doped surfaces is illustrated in FIGS. 1A and 1B. One result of this quantization is an increase in the effective band gap of the 2D-doped surface, as the near-surface Fermi level is driven deep into the valence band. FIG. 1A is a plot of quantum confinement in a 2D-doping superlattice. FIG. 1B is a plot of near-surface hole concentration. Quantum confinement of near-surface electron and hole states plays an essential role in the physics and stability of 2D-doped silicon detectors. Electron and hole wavefunctions represented may be calculated using nextnano++, which solves the Schrödinger and Poisson equations self-consistently for nanostructured semiconductor devices. FIGS. 1A and 1B show that the surface of a 2D-doped detector is strongly accumulated, with a surface effective bandgap>1.5 eV. Quantization of surface hole states also may lead to a high density of holes in 2D-doped surfaces, which may suppress surface dark current and persistence for front- and back-surface passivation of CCD interfaces.

In some embodiments, the delta-doped CCDs may be manufactured utilizing a 3" Riber MBE system that may only process one detector at a time. Detectors may be prepared using a frame-thinning process, which only removes the substrate in the imaging area, while leaving the edges of the detector thick enough to support the membrane. Frame-thinned CCDs may be prone to significant warping of the imaging surface due to residual stresses in the front side oxides and gate structures. The utility of these devices for scientific imaging was therefore severely limited by poor surface flatness, and by the inability to scale the frame-thinning process to the large, buttable devices utilized by astronomers.

Figure 2B:
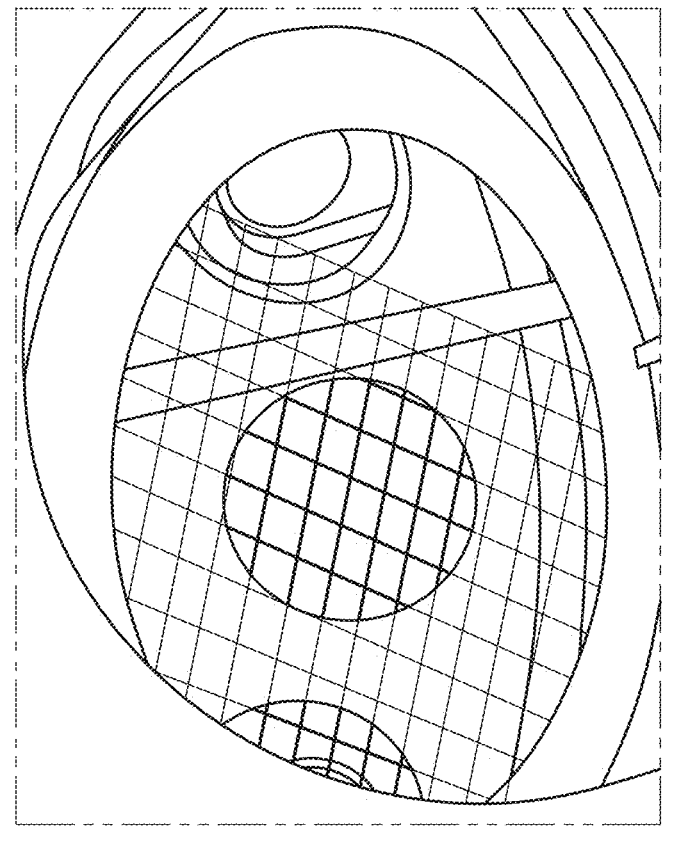
FIG. 2B is a wafer with CMOS detectors in the MBE chamber of the silicon MBE system of FIG. 2A in accordance with an embodiment of the invention.
Figure 2A:
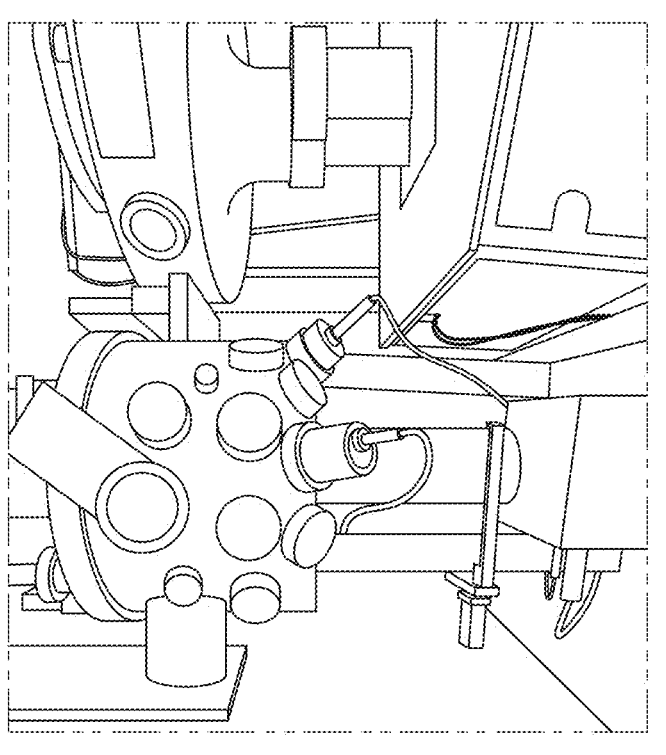
FIG. 2A is an image of a production-scale silicon MBE system in accordance with an embodiment of the invention.

In some embodiments, computer-controlled MBE systems is equipped with a robotic system for automated transfer of wafers under ultra-high vacuum (UHV) between a cluster chamber and a separate growth chamber may be utilized to produce the delta-doped CCDs. These production-scale molecular beam epitaxy (MBE) systems may process 150 mm and 200 mm silicon detector wafers with high throughput and high yield. FIG. 2A is an image of a production-scale silicon MBE system in accordance with an embodiment of the invention. FIG. 2B is a wafer with CMOS detectors in the MBE chamber of the silicon MBE system of FIG. 2A in accordance with an embodiment of the invention. The silicon MBE system enables high volume manufacturing of 2D-doped detectors. FIG. 2B shows a bonded and thinned 200 mm detector wafer in the MBE chamber. Although the surface in the photograph is bare, atomically clean silicon ready for MBE growth, at an overall thickness of about 3 microns, the silicon epilayer is thin enough that front-surface detector structures are visible through the partially transparent silicon epilayer.

The 2D-doping process may begin with planarization and oxide-oxide bonding of detector wafers. After bonding, the device wafers may be thinned to expose the detector epilayer for back illumination. The thinning process may include a grinding process for coarse thinning, followed by a chemical etch to selectively remove the highly-doped silicon substrate. The chemical etch may be a hydrofluoric, nitric, acetic (HNA) etch. The HNA etch may include a ratio of 1:3:8 HF:HNO$_3$:H$_2$O. After substrate removal, a chemical-mechanical polish (CPM) may remove additional silicon, leaving the wafer with a uniform, mirror finish with nanometer-scale surface roughness. Wafers may be prepared using cleaning processes to remove organic and metallic contaminants. The final surface preparation steps prior to MBE growth may be performed in a nitrogen-purged glove box. A UV-ozone process may be performed to remove residual carbon contamination, and the native oxide is removed with a spin-clean process.

Eight wafers may be loaded at a time into the MBE system. Detector wafers may be placed face-down on 10 inch platens and loaded into an elevator in the introduction chamber of the MBE system. The introduction chamber may then be evacuated using a clean cryopump system, and wafers may be robotically transferred into a UHV cluster chamber, where they are loaded into an 8-position elevator for temporary storage. Wafers may be transferred one at a time into a separate UHV chamber for MBE growth. The MBE growth chamber may be equipped with a radiative substrate heater for controlling the wafer temperature, an e-beam source for deposition of silicon, and multiple effusion cells for deposition of dopants. All sources may be equipped with shutters. Epitaxial growth of 2D-doped silicon may be performed by controllably heating the wafer to between 400° C. and 425° C. When the substrate temperature rises above 370° C., the atomic structure of the silicon surface may change from di-hydride to monohydride termination of silicon, which may be conditions for epitaxial growth. Growth of 2D-doped silicon proceeds by alternately depositing silicon and dopant atoms, using shutters to control the source fluxes. Under these conditions, silicon and dopant atoms are integrated into the silicon lattice, forming an epitaxial layer of silicon with atomic layer control over the dopant profile. The atomically abrupt "delta-doped" structure may be formed by closing the silicon shutter and opening the dopant shutter in order to deposit a fraction of a monolayer of dopant atoms on the atomically-flat silicon surface. Once this layer is formed, the dopant shutter is closed and the silicon shutter is opened to resume epitaxial growth of silicon.

Embodiments Including MBE Growth Processes and Surface Passivation Strength in 2D-Doped Detectors As discussed above, the multilayer 2D-doped layer (e.g. the delta-doped layer) may improve the strength and stability of detector passivation for high radiation environments. The 2D-doping superlattice may include a series of stacked delta-doped layers. Although the total thickness of the 2D-doping superlattice is only a few nanometers, this multilayer structure can contain an integrated dopant density that's comparable to or greater than the integrated dopant density in the ion-implanted surfaces used to passivate state-of-the-art back illuminated CCDs and CMOS imaging detectors, while still achieving stable, near 100% charge collection efficiency.

Figure 3B:
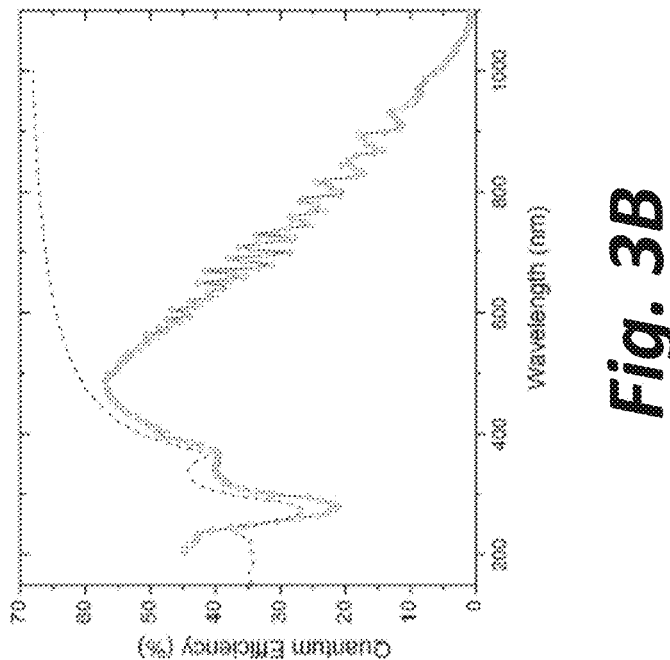
FIG. 3B is a plot of measured quantum efficiency of back-illuminated the superlattice-doped CMV12000 device illustrated in FIG. 3A.
Figure 3A:
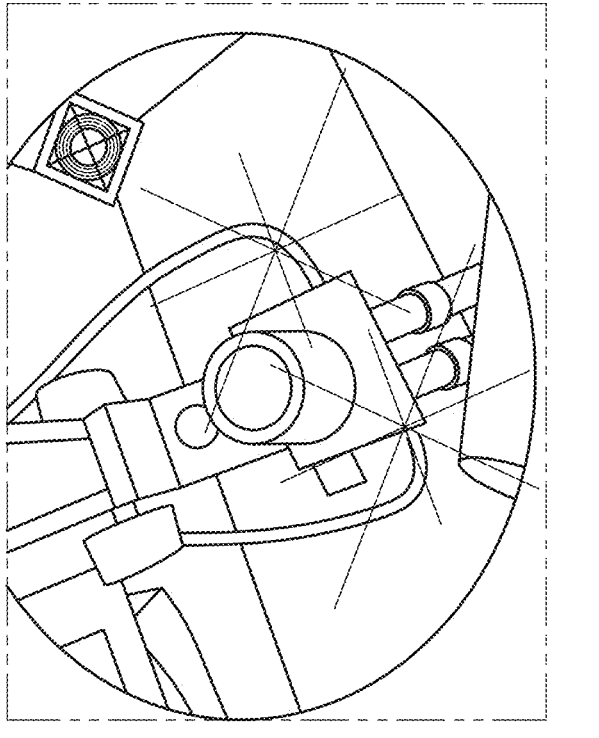
FIG. 3A is an image of a 2D-doped CMOS wafer with CMV12K devices after bonding, thinning, and MBE/ALD passivation.

2D-doped CMOS detectors show unique stability against radiation-induced surface damage, and QE measurements show nearly 100% charge collection efficiency with wafer-scale 2D-doping processes. FIG. 3A is an image of a 2D-doped CMOS wafer with CMV12K devices after bonding, thinning, and MBE/ALD passivation. FIG. 3B is a plot of measured quantum efficiency of back-illuminated the superlattice-doped CMV12000 device illustrated in FIG. 3A. With a charge collection efficiency of approximately 90%, this detector is nearly QE-pinned, but the difference may indicate weak surface passivation due to damage to the detector from the thinning process.

The CMOS detectors may be 3 k×4 k super high definition CMOS detectors and fabricated on 200 mm wafers using a 0.18 μm process. The wafers may be bonded to a 200 mm silicon wafer for mechanical support. A final thinning and surface passivation at full wafer scale may be performed using an MBE-grown 2-layer superlattice. Atomic layer deposition (ALD) may be utilized to grow a 2 nm $Al_2O_3$ layer on the back-illuminated surface. The final device thickness may be between 2 and 3 μm. For reference, in FIG. 3B, the optical transmittance of silicon with a 2 nm $Al_2O_3$ coating is plotted as a dashed line. The observed falloff in quantum efficiency and interference fringes at wavelengths longer than 500 nm are consistent with the measured 2 to 3 μm thickness of devices after thinning. At short wavelengths (e.g. below ~300 nm), the QE may exceed the optical transmission into silicon, which is consistent with multiple electron-hole pair production by high energy photons. The difference between the silicon transmittance and the QE suggests that about 90% of UV photons are detected.

Figures 4A, 4B:
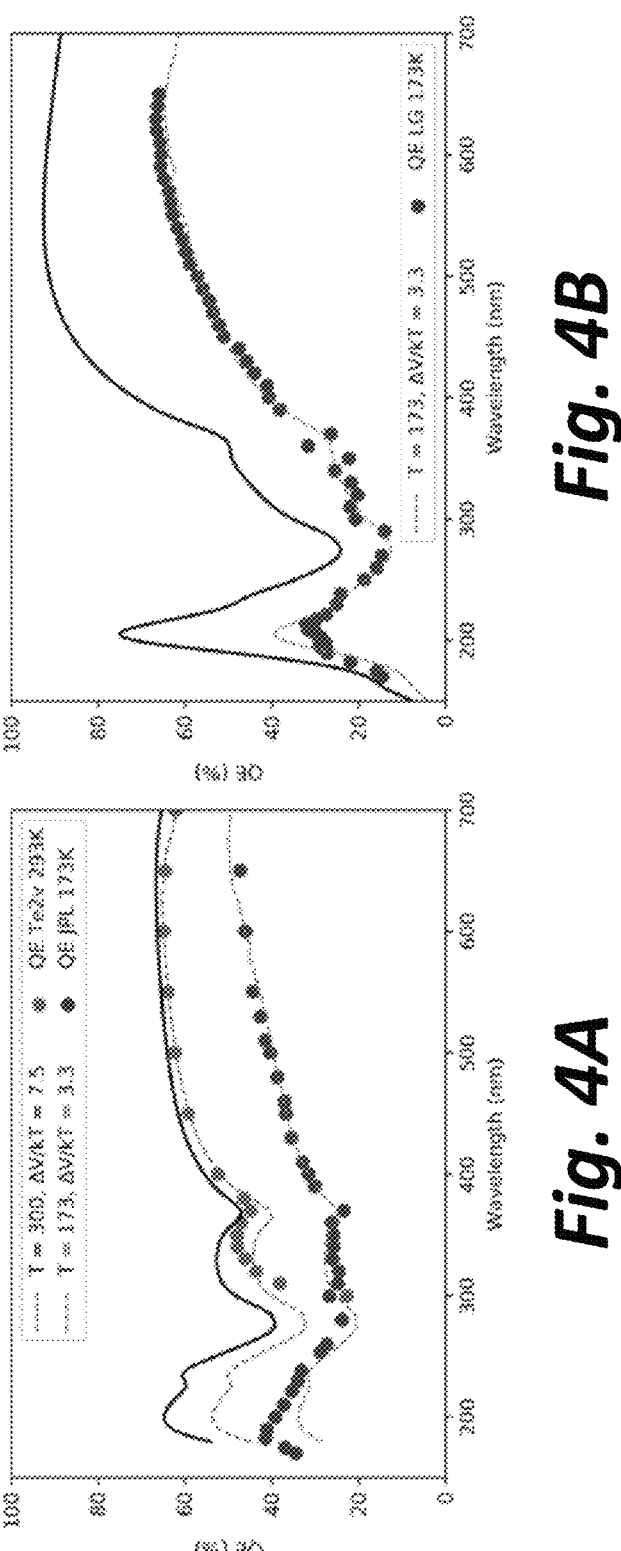
FIG. 4A is a plot of a CMOS detector operating at two separate temperatures, 300 degrees K and 173 degrees K (−100 degrees C.).
FIG. 4B is a plot of a CMOS detector operating at 173 degrees K (−100 degrees C.).

While the QE of the CMOS detector may be very high, the difference between 90% and 100% charge carrier efficiency (CCE) may indicate a latent problem. The QE data shown in FIG. 3B were measured at room temperature. It has been discovered that low temperature QE measurements unexpectedly revealed a strongly temperature-dependent QE in some detectors that were processed at full wafer scale. FIG. 4A is a plot of a CMOS detector operating at two separate temperatures, 300 degrees K and 173 degrees K (−100 degrees C.). FIG. 4B is a plot of a CMOS detector operating at 173 degrees K (−100 degrees C.). Each of these plots illustrates in the black bold line, the reflection limit across the entire spectral range from UV to visible. These plots illustrate an MBE growth on chemical mechanical polished (CMP) processed detectors leads to weak surface passivation. The CMP may cause damage which leads to weak surface passivation. As illustrated in FIG. 4A, although nearly QE-pinned at room temperature (300 degrees K), at −100° C. (173 degrees K) the QE of these two CCDs is about two times below the reflection limit across the entire spectral range from UV to visible. Thus, there is a degradation of QE with temperature. In this example, $V_S{\approx}0.2V$ and $S_0{\approx}3{\times}10^6$ cm/s.

It has been determined that this QE(T) signature may be a sign of weak passivation. The dashed lines in FIGS. 4A and 4B illustrate the trend for QE with respect to wavelength. The QE(T) matches the data for a combination of low surface potential ($V_S$~0.21V and high surface recombination velocity ($S_0$~$3{\times}10^6$ cm/s), which may indicate that the integrated trap density in these detectors is very high. The energy barrier may vary from 8.1 kT at room temperature to 3.8 kT at 173 degrees K, in apparent contradiction with the calculated band structure of 2D-doped detectors (see FIGS. 1A and 1B).

There may be a high density of traps, but the traps may not be located above the delta-doped layer but at the interface between the delta-doped layer and the thinned detector. Weak passivation in these detectors may be caused by defects in the detector surface. It has been determined that the traps may be produced from the chemical-mechanical polishing (CMP) process used during thinning. Although defects in CMP-prepared surfaces are difficult to detect, near-surface silicon vacancies have been observed. It was observed that the CMP-damaged detectors may remain stable and amenable to calibration, provided the detector temperature remains stable. However, there has been over-served a strong QE(T) dependence which lowers QE at lower temperatures.

To remove traps that remain from the CMP process used during thinning, a post CMP processing may be applied before MBE growth of the delta-doped layer. Various embodiments of the invention include etching the detector surface to remove CMP-damaged silicon before the subsequent MBE growth.

A surface band structure of CMP-damaged detectors may be utilized for further optimization of the 2D-doping process. A comparison of QE data, nextnano++ models of CMP-damaged detectors, and the QE(T) model shows that the defects are very shallow, within a few nanometers of the MBE-detector interface. The correlations of detector data, nextnano++ band structure calculations, and QE(T) models indicated that CMP damage includes a very shallow distribution of traps with integrated density on the order of $5{\times}10^{13}$ $cm^{-2}$.

Figure 5B:
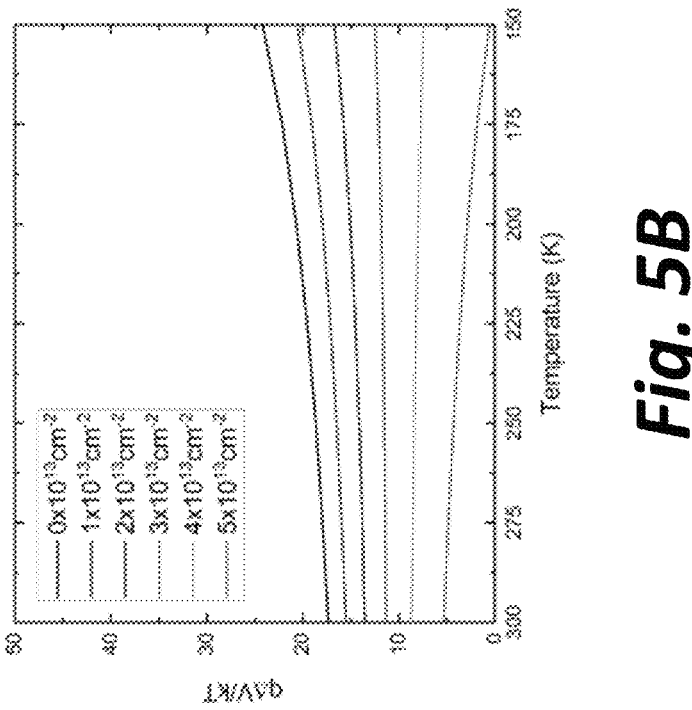
FIG. 5B is a bandgap calculation for barrier vs temperature for various damage densities.
Figure 5A:
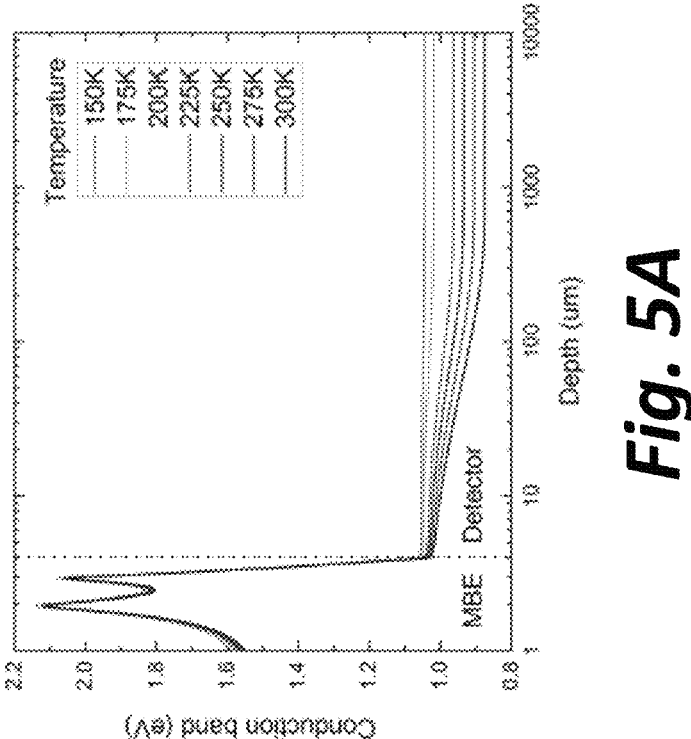
FIG. 5A is a band gap calculation of the conduction band edge. In this example, $N_{it}=5\times10^{13}$ cm$^{-2}$.
Figure 5D:
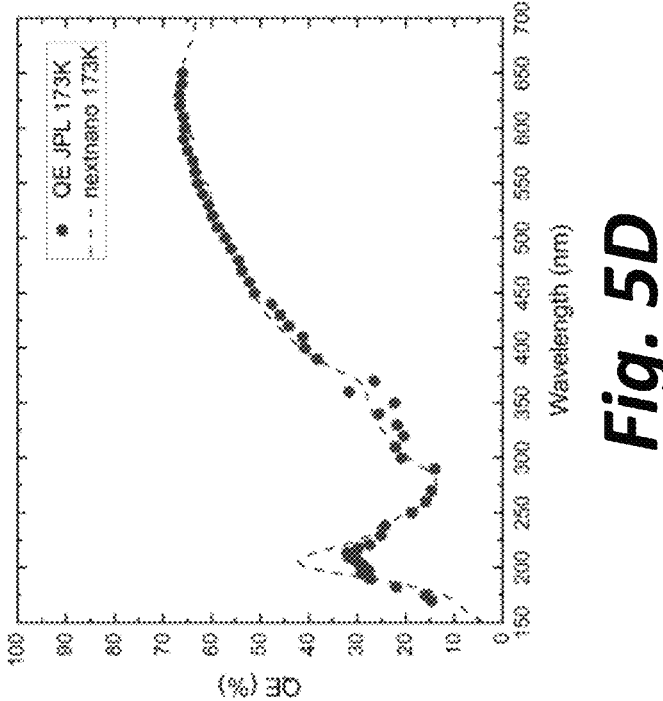
FIG. 5D is the QE vs wavelength of a device at 173 degrees K.
Figure 5C:
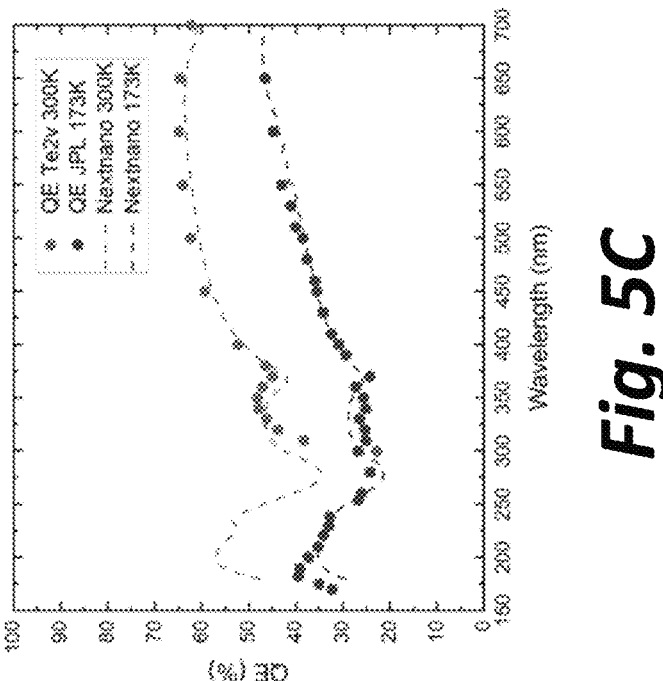
FIG. 5C is the QE vs wavelength of a device at 173 degrees K and a device at 300 degrees K.

FIG. 5A is a band gap calculation of the conduction band edge. In this example, $N_{it}{=}5{\times}10^{13}$ $cm^{-2}$. FIG. 5B is a bandgap calculation for barrier vs temperature for various damage densities. FIG. 5C is the QE vs wavelength of a device at 173 degrees K and a device at 300 degrees K. FIG. 5D is the QE vs wavelength of a device at 173 degrees K. The solid dots are measured results and the dotted lines correlate to simulated results which appear to match with the measured results. Each of these devices include the CMP damage which creates a significant temperature dependence on the QE. The trap density was adjusted to reproduce the temperature-dependent QE observed in damaged detectors.

In some embodiments, the thin damaged layer created through CMP damage may be removed with a standard silicon cleaning process, which both cleans and etches the silicon surface. In some situations, the oxide-oxide bonded wafers may delaminate during cleaning which prevents the standard silicon cleaning process that would have eliminated the CMP damage from being utilized. Thus, a specific surface etch process was applied after the CMP step. The surface etch process may include a piranha clean process. The piranha clean process may be wet etch process including a 3:1 mixture of sulfuric acid and 30% hydrogen peroxide. In some embodiments, the surface etch process may further include a slight etch method such as a Takizawa's slight etch method. The Takizawa's slight etch may include a wet etch with nitric acid including a trace of hydrofluoric acid. The Takizawa's "slight etch" may occur after the piranha clean process. In some embodiments, the surface etch process may further include an ammonium fluoride etching step. The ammonium fluoride etching step may be a wet etch of the surface including ammonium fluoride. The ammonium fluoride etching step may occur after the Takizawa's "slight etch." It was demonstrated that this surface etch process successfully removes the damage and solved the QE(T) issue. After the surface etching process, a decontaminated surface may be produced which may an atomically flat silicon 100 surface with surface and subsurface damage and contamination significantly reduced.

The surface etching process may further include a UV ozone process to the resultant decontaminated surface. The surface etching process may further include an HF spin etch after the ozone process. The surface etching process may further include an ethanol rinse after the HF spin etch.

In some cases, the MBE growth of delta-doped silicon on the thinned CCD surface may include growing a silicon buffer layer approximately 1 nm in thickness. The use of buffer layers in MBE growth may serve to encapsulate any contaminants or defects that may remain on the surface, and to form an atomically clean and smooth surface conducive to high quality crystalline growth. However, the discovery of the QE(T) issue resulting from growth on CMP-damaged detectors revealed a latent problem with this process, insofar as the thickness of the buffer layer amplifies the effect of defects and contaminants on detector QE.

Figure 6B:
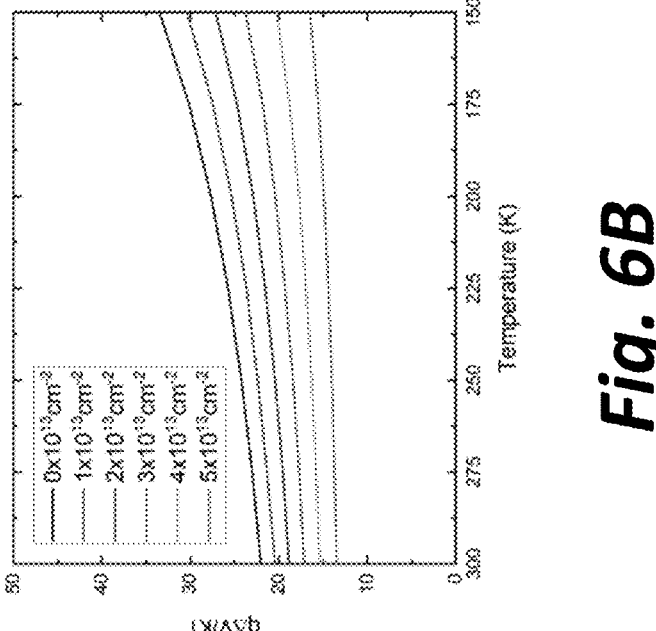
FIGS. 6A-6D are various plots illustrating results of a 3-layer superlattice which includes enhanced QE by optimizing the 2D-doping process.
Figure 6A:
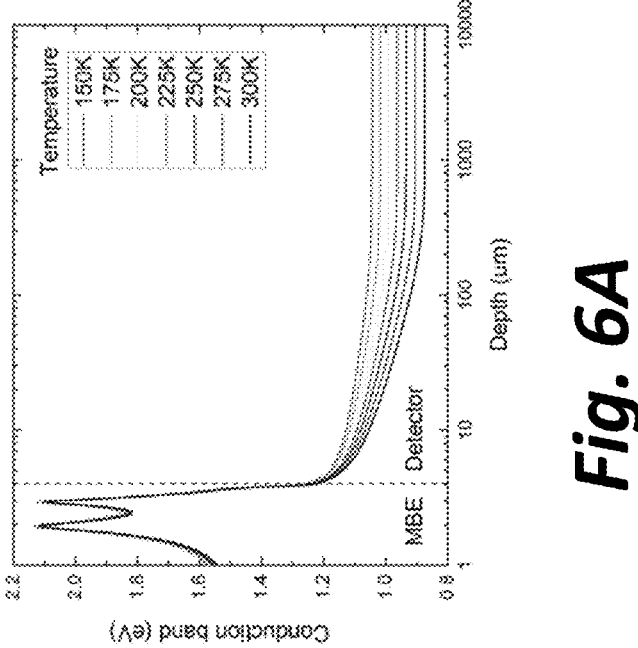

In some embodiments, a third delta layer, positioned as close to the MBE-detector interface as possible, may be included to compensate for any charge trapped near the detector surface. FIGS. 6A-6D are various plots illustrating results of a 3-layer superlattice which includes enhanced QE by optimizing the 2D-doping process. As illustrated, optimization of the MBE layer structure by adding a third delta layer located as close as possible to the MBE-detector interface significantly improves the strength of surface passivation relative to the 2-layer superlattice illustrated in FIGS. 5A-5D. Even for exceptionally high trap densities (e.g. $5\times10^{13}$ cm$^{-2}$), the detector remains QE-pinned over the full temperature range relevant to space. Thus, the above mentioned QE(T) issue in FIGS. 5A-5D was effective eliminated. FIG. 6A is a band gap calculation of the conduction band edge for a MBE-detector interface of an MBE grown 3-layer superlattice. $N_{it}=5\times10^{13}$ cm$^{-2}$. FIG. 6B is a bandgap calculation for barrier vs temperature for various damage densities of Barrier height (T) in the MBE grown 3-layer superlattice.

Figure 6D:
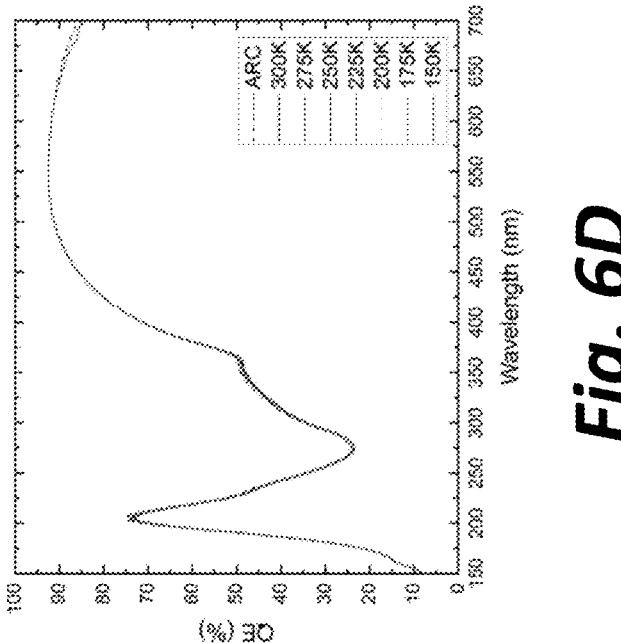
Figure 6C:
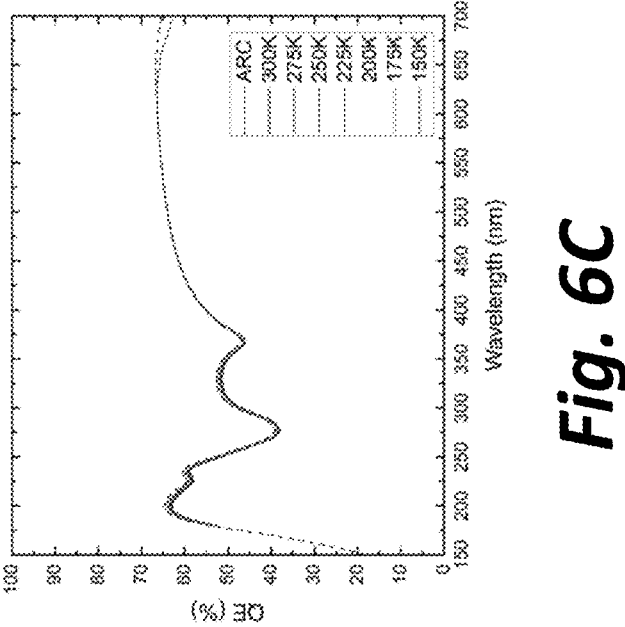

FIG. 6C is an example QE plot over a wavelength spectrum of a CMP-damaged CCD. FIG. 6D is an example QE plot over a wavelength spectrum of a CMP-damaged CCD. The devices disclosed in FIGS. 6C and 6D may include a MBE grown 3-layer superlattice structure. The devices may include a detector which may be thinned with a CMP process and then subjected to a surface etch process which may repair the damage produced by the CMP process. Advantageously the CCDs may be highly insensitive to traps at the MBE-detector interface. The dotted line represents the reflection limit across the entire spectral range from UV to visible. As illustrated, for various temperatures from 150 degrees K to 300 degrees K, the detectors substantially possess QE which is locked at the reflection limit across the entire spectral range from UV to visible. Thus, the QE of these devices are substantially insensitive to deviations in temperature.

FIG. 7 is a flow chart of the surface etch process described above which occurs after CMP of the detector in accordance with an embodiment of the invention. The process 700 includes providing (702) a detector including a detector surface. The detector may be a silicon detector. The detector may include a circuitry surface opposite to the detector surface with CCD circuitry. The process 700 further includes performing (704) a planarization process to the detector surface. The planarization process may include a CMP process. As discussed above, the CMP process may introduce damage to the detector surface. The planarization process may include a wafer thinning process. The wafer thinning process may be a grinding process.

The process 700 further includes performing (706) a piranha clean process to the planarized surface. The piranha clean process may be wet etch process including a 3:1 mixture of sulfuric acid and 30% hydrogen peroxide. The process further includes performing (708) a slight etch to the piranha cleaned surface. The slight etch is a Takizawa's slight etch process. The Takizawa's slight etch process is a wet etch with nitric acid including a trace of hydrofluoric acid. The process 700 further includes performing (710) an ammonium fluoride etching step to the slight etched surface to create a decontaminated surface. The decontaminated surface is an atomically flat silicon 100 surface with surface and subsurface damage and contamination significantly reduced.

The process 700 further includes epitaxially growing (712) a multilayer 2D-doped layer on the decontaminated surface. The detector demonstrates near high quantum efficiency with uniform and stable performance from room temperature to cryogenic temperatures. The epitaxial growth may include a growth of 2D-doped silicon by alternately depositing silicon and dopant atoms, using shutters to control the source fluxes. The shutters may control sources such that the decontaminated surface is alternately and cyclically contacted with a source including silicon and a source including dopants. This creates alternating intrinsic silicon layers and dopant layers. This produces an extremely sharp dopant profile in which the dopant is confined to only a few atomic layers, creating an electric field high enough to confine the backside surface potential well to within half a nanometer of the surface. Under these conditions, silicon and dopant atoms are integrated into the silicon lattice, forming an epitaxial layer of silicon with atomic layer control over the dopant profile.

Figure 8:
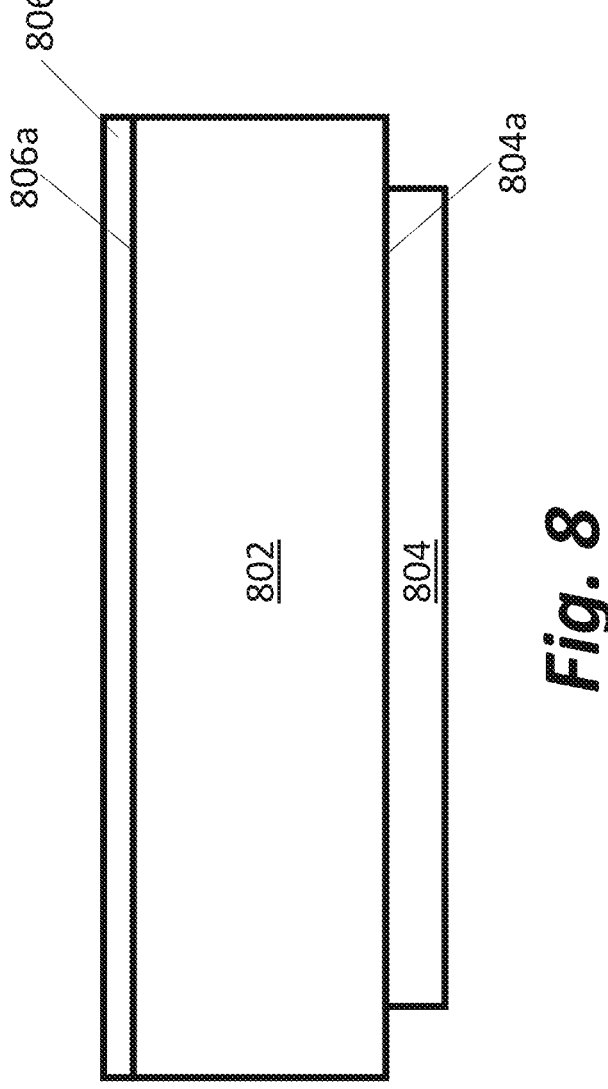
FIG. 8 is a cross sectional view of an image sensor produced utilizing the process described in FIG. 7 in accordance with an embodiment of the invention.

FIG. 8 is a cross sectional view of an image sensor produced utilizing the process described in FIG. 7 in accordance with an embodiment of the invention. As illustrated, the image sensor includes a detector 802. The detector 802 includes a detector surface 806a. The detector 802 includes a bulk silicon wafer. The detector surface 806a is decontaminated utilizing the process described in FIG. 7. Further, an epitaxial growth process described in step 712 of FIG. 7 is utilized to grow a 2D-doped silicon 806 on the detector surface 806a. The detector 802 may be a detector which has been previously thinned and subjected to a CMP process. As discussed previously, the CMP process produces contaminants which effect the performance of the detector. Thus, the decontamination process reduces the number of contaminants on the detector surface 806a which provides a clean surface for the growth of the 2D-doped silicon 806. The 2D-doped silicon 806 may be a delta-doped layer. The detector 802 may include a circuitry surface 804a opposite to the detector surface 806a with CCD circuitry 804.

DOCTRINE OF EQUIVALENTS

While the above description contains many specific embodiments of the invention, these should not be construed as limitations on the scope of the invention, but rather as an example of one embodiment thereof. It is therefore to be understood that the present invention may be practiced in ways other than specifically described, without departing from the scope and spirit of the present invention. Thus, embodiments of the present invention should be considered in all respects as illustrative and not restrictive. Accordingly, the scope of the invention should be determined not by the embodiments illustrated, but by the appended claims and their equivalents.

What is claimed is:
1. A method of coating a detector, the method comprising:
providing the detector comprising a detector surface;
performing a planarization process to the detector surface;

performing a piranha clean process to the planarized surface;

performing a slight etch to the piranha cleaned surface;

performing an ammonium fluoride etching step to the slight etched surface to create a decontaminated surface, wherein the decontaminated surface is an atomically flat silicon surface with surface and subsurface damage and contamination significantly reduced; and epitaxially growing a multilayer 2D-doped layer on the decontaminated surface.

2. The method of claim 1, wherein the planarization process includes a chemical mechanical polishing (CMP) process.

3. The method of claim 1, wherein the planarization process includes a wafer thinning process.

4. The method of claim 3, wherein the wafer thinning process is a grinding process.

5. The method of claim 1, wherein the slight etch is a Takizawa's slight etch process.

6. The method of claim 5, wherein the Takizawa's slight etch process is a wet etch with nitric acid including a trace of hydrofluoric acid.

7. The method of claim 1, further comprising performing a UV ozone process to the resultant decontaminated surface.

8. The method of claim 7, further comprising performing an HF spin etch after the ozone process.

9. The method of claim 8, further comprising performing an ethanol rinse after the HF spin etch.

10. The method of claim 1, wherein the epitaxial growth process is an MBE crystalline growth.

11. The method of claim 10, wherein the MBE crystalline growth produces a multi-layered delta doped crystalline layer with alternating doped and undoped layers.

12. The method of claim 11, wherein the undoped layer is intrinsic silicon and doped layer includes boron.

13. The method of claim 12, wherein producing the multi-layered delta doped crystalline layer includes alternately and cyclically contacting the decontaminated surface with a source including silicon and a source including dopants.

14. The method of claim 1, wherein the detector comprises a silicon detector with a bulk silicon wafer.

15. The method of claim 1, wherein the detector comprises a circuitry surface opposite to the detector surface with CCD circuitry.

16. The method of claim 1, wherein the piranha clean process is wet etch process including a 3:1 mixture of sulfuric acid and 30% hydrogen peroxide.

17. The method of claim 1, wherein the detector comprises high quantum efficiency with uniform and stable performance from room temperature to cryogenic temperatures.

18. The method of claim 17, wherein the detector comprises quantum efficiency substantially equivalent to a reflection limit across an entire spectral range from UV to visible from room temperature to cryogenic temperatures.

* * * * *